US006018202A

United States Patent [19]

Meinders et al.

[11] Patent Number: 6,018,202

[45] Date of Patent: Jan. 25, 2000

[54] IGNITION OUTPUT STAGE

[75] Inventors: Horst Meinders, Reutlingen; Richard Schleupen, Ingersheim, both of Germany

[73] Assignee: Robert Bosch GmbH, Stuttgart, Germany

[21] Appl. No.: 09/029,781

[22] PCT Filed: Jun. 27, 1996

[86] PCT No.: PCT/DE96/01140

§ 371 Date: Mar. 9, 1998

§ 102(e) Date: Mar. 9, 1998

[87] PCT Pub. No.: WO97/10432

PCT Pub. Date: May 20, 1997

[30] Foreign Application Priority Data

Sep. 12, 1995 [DE] Germany ........................... 195 33 637

[51] Int. Cl.[7] ...................................................... B60R 22/00

[52] U.S. Cl. ............................................ 307/10.6; 361/253

[58] Field of Search .................................. 307/10.1, 10.6, 307/100; 361/247, 253, 263; 327/483, 575; 315/206–208, 209 T

[56] References Cited

U.S. PATENT DOCUMENTS

| | | | |
|---|---|---|---|
| 4,064,415 | 12/1977 | Blackington | 315/209 T |
| 5,424,671 | 6/1995 | Höhne et al. | 327/483 |
| 5,559,661 | 9/1996 | Meinders . | |

FOREIGN PATENT DOCUMENTS

| | | |
|---|---|---|
| 23 39 896 | 2/1975 | Germany . |

*Primary Examiner*—Richard T. Elms
*Attorney, Agent, or Firm*—Kenyon & Kenyon

[57] ABSTRACT

An ignition output stage is described, in particular for an internal combustion engine, in which the output stage is constructed as a two- or three-stage Darlington and provided either with an internal single-stage or an external multiple-stage clamping via a Zener diode for protection from surges, while a short-circuit transistor is provided for protection from parasitic currents at the control terminal of the Darlington in parallel to the base-emitter junction of the ignition Darlington.

5 Claims, 3 Drawing Sheets

IGNITION OUTPUT STAGE

FIELD OF THE INVENTION

The present invention relates to an ignition output stage.

BACKGROUND INFORMATION

German Patent Application No. 23 39 896 describes an ignition output stage for internal combustion engines. This primary winding of the ignition coil is connected in series with the interrupter assembly of a switching transistor. The switching transistor is implemented as a Darlington circuit, with a Zener diode connected in parallel to the collector-base system. This Zener diode ensures that the voltage at the interrupter assembly of the switching transistor does not exceed a permissible value. High voltages that represent a danger to the switching transistor occur, in particular, during the transition of the switching transistor interrupter assembly into the off state and are generated by the high voltage transformed to the primary side.

If the collector-emitter voltage reaches the Zener voltage of the base-collector diode, a Zener current flows to the base of the ignition Darlington. This is again switched to the on state so in clamping operation, simultaneously a voltage is present and current flows until the ignition spark on the secondary side of the coil sparks over the coil and the rest of the coil energy flows into the spark gap.

The ignition coil of an ignition circuit is connected with rotating distribution over an ignition distributor to the corresponding ignition spark plug of the internal combustion engine or, with static distribution, directly to the spark plug. In this arrangement very large cable lengths occur between the individual connections, e.g., between the switching transistor and the ignition coil and between the switching transistor and ground and between the triggering circuit of the ignition Darlington and the base of the ignition Darlington. The ohmic resistances and inductances that are present because of the electric cable have an antenna effect, so that during the ignition process the base wiring of the switching transistor is supplied with weak parasitic base current which leads to the ignition voltage only slowly reaching the value necessary for ignition, since the switching transistor is somewhat notched up again by this parasitic current. This effect can be taken into account by using the shortest possible emitter and collector wires or by the use of shielded control wires for the switching transistor base.

SUMMARY OF THE INVENTION

The present invention has an advantage of simply, cost-effectively and very reliably protecting the base wiring of the switching transistor from parasitic effects. In addition, the circuit can be used very well in monolithical integration.

DETAILED DESCRIPTION OF THE INVENTION

Figure 1:
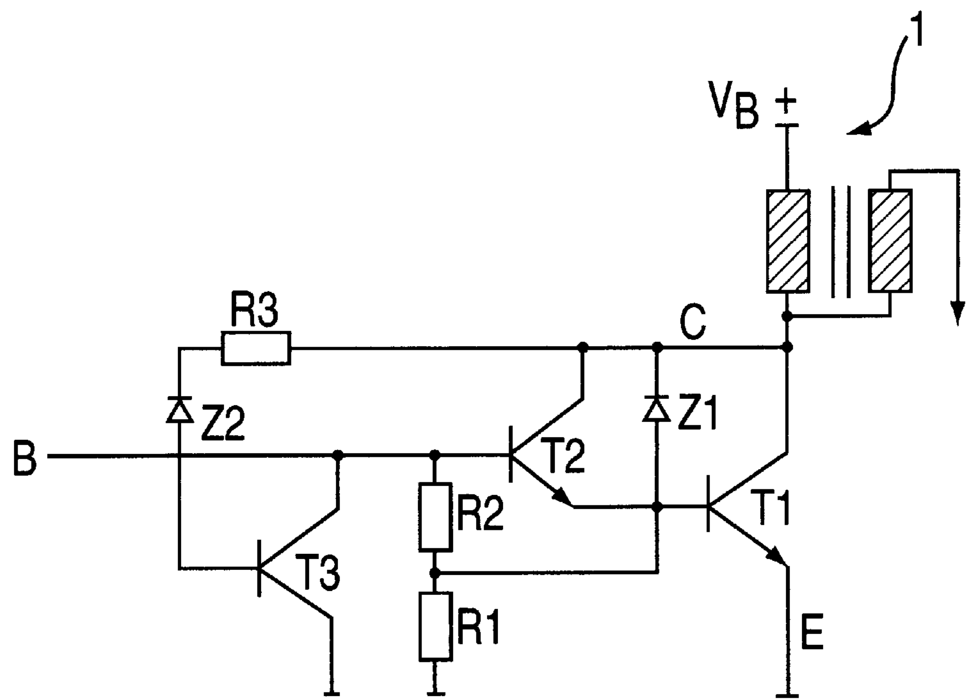
FIG. 1 shows a first exemplary embodiment of an ignition output stage with internal single-level clamping and short-circuit transistor according to the present invention.

FIG. 1 shows a schematic diagram of an ignition output stage with an internal, single-level Zener clamp, as used for internal combustion engine ignition systems. The circuit in FIG. 1 includes ignition coil 1, which is connected on the secondary side to an ignition spark plug that is not shown. The primary winding of ignition coil 1 is connected on one side to voltage supply $U_S$, for example, the battery of the vehicle that is not shown, and on the other side to ground through power transistor T1. A driver transistor T2 is connected upstream from the power transistor T1 so that a two-stage Darlington transistor results. The collector-emitter junction of the power transistor is in series with the primary winding and the power transistor base is connected to the emitter of driver transistor T2. Base-emitter resistors R1 and R2 are assigned to the power transistor T1 and driver stage T2, respectively.

Zener diode Z1 is provided in parallel to the collector-base junction of power transistor T1. Zener diode Z1 is used to protect power transistor T1 from surges if it induces a high voltage when the charging current is switched off in the ignition coil. This occurs in that the Zener diode breakdown current flows into the base of power transistor T1 and the Darlington is again fully notched up. This arrangement of Zener diode Z1 parallel to the collector-base system of power transistor T1 within the Darlington transistor is an internal, single-stage clamping. However, this arrangement is already known in the art. The feature essential to the present invention includes the mounting of a short-circuit transistor T3, with the collector-emitter junction of short-circuit transistor T3 being connected in parallel to the base-emitter junction of the Darlington transistor, i.e., the short-circuit transistor collector is connected to the base connector of driver transistor T2 and the short-circuit transistor emitter T3 is connected through ground to the emitter of driver transistor T2. In the connection from the collector of driver transistor T2 of the Darlington transistor to the base of short-circuit transistor T3, there is a resistor R3 and second Zener diode Z2. Second Zener diode Z2 prevents the short-circuit transistor T3 from being notched up already during the ignition coil charging phase if the Darlington collector potential comes into the operating voltage range. Resistor R3 is specified such that with a clamp voltage of 300 to 400 V in Zener diode Z1, sufficient base current can flow for short-circuit transistor T3.

Figure 2:
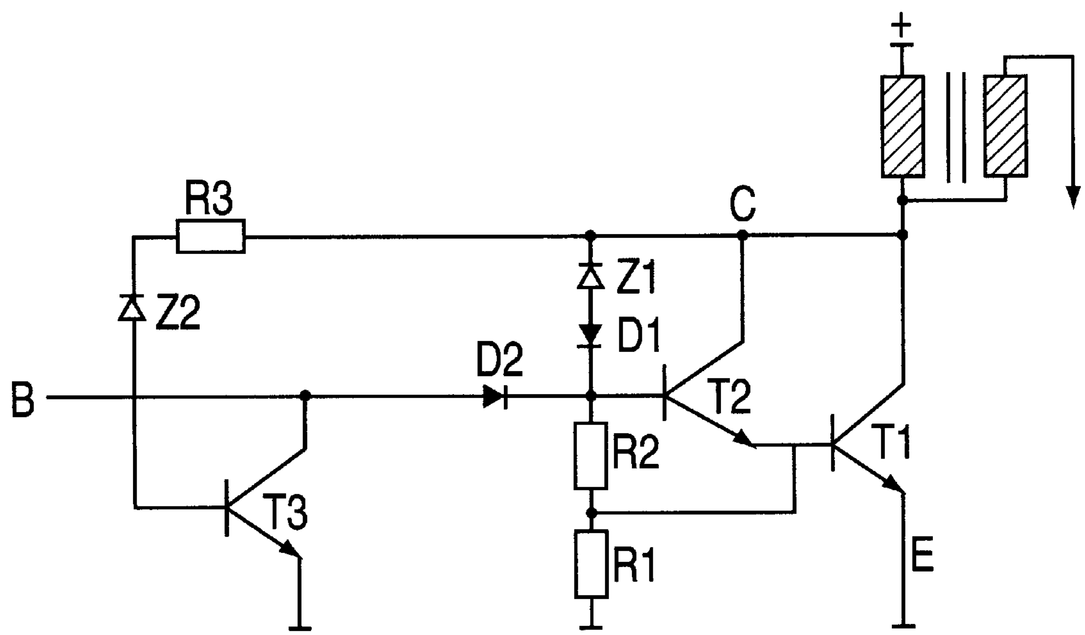
FIG. 2 shows a second exemplary embodiment of an ignition output stage with external, multi-stage clamping and short-circuit transistor.

FIG. 2 shows another exemplary embodiment. The arrangement of the Darlington transistor and the ignition coil corresponds to the arrangement in FIG. 1 and the same components are identified with the same reference numbers. In contrast to FIG. 1, this ignition system has an external, multi-stage clamping, i.e., Zener diode Z1 for the clamping is arranged in parallel to the collector-emitter junction of driver transistor T2, thus outside the two-stage Darlington transistor. In addition, in series with first Zener diode Z1, a diode D1 is arranged between Zener diode Z1 and the base terminal of driver transistor T1. Diode D1 is used to decouple the driver transistor base from the Darlington collector. From the tap between the primary winding and collector of the control transistor, which simultaneously forms the collector of the Darlington, the clamp branch including Zener diode Z1 and diode D1 is routed to the control terminal of the Darlington, i.e., to the base of driver transistor T2. In addition, this tap is connected at the connecting point between the primary winding and collector of the Darlington, as in FIG. 1, via protective resistor R3 and second Zener diode Z2, to the base of short-circuit transistor T3. Its operating mode was already explained for FIG. 1. In FIG. 2, in contrast to FIG. 1, second diode D2 is arranged between the collector of short-circuit transistor T3 and the Darlington control terminal, with the second diode uncoupling the clamp circuit so that only the base current required to maintain the collector current that is already flowing over the clamp circuit can flow. Every parasitic base current is short-circuited here.

Figure 3:
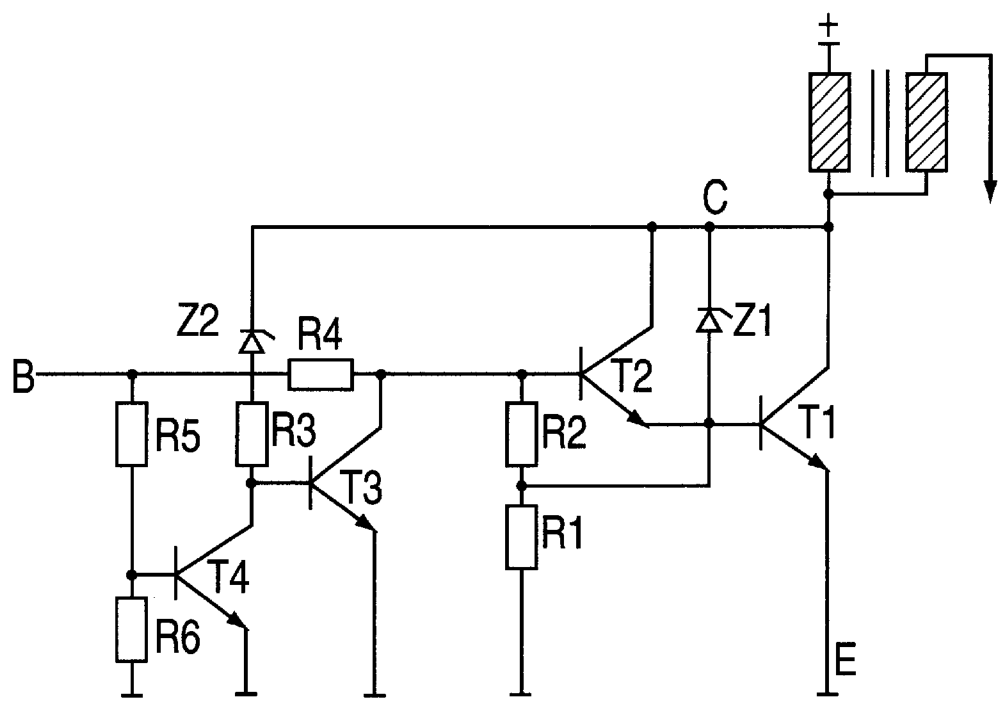
FIG. 3 shows a third exemplary embodiment of an ignition output stage with internal single-stage clamping and short-circuit transistor.

FIG. 3 shows a third exemplary embodiment of the short circuit according to the present invention. As in FIG. 1, in this arrangement the triggering of the charging current also occurs through the ignition coil by a two-stage Darlington transistor. The voltage clamping for protection from surges is designed as a single-stage internal clamping which was already explained in FIG. 1. In contrast to FIG. 1, the Darlington has a base input resistor R4 which provides for the Darlington being switched from being de-energized to the triggered status. The collector of short-circuit transistor T3 is connected between base resistor R4 and the control terminal of the Darlington. The base of the short-circuit transistor is, as in FIG. 1, connected using a protective resistor R3 to the Darlington collector. In parallel to the base input resistor R4, a voltage divider for resistors R5 and R6 is connected to ground, the voltage divider tap being connected to the base of fourth transistor T4. The collector of fourth transistor T4 is routed to the connection between protective resistor R3 and base of short-circuit transistor T3. In this way, the triggering current for short-circuit transistor T3 is obtained from the inverted triggering current for the base of the Darlington. If a triggering signal is present at the base of the Darlington, the collector of the fourth transistor is at ground potential and short-circuit transistor T3 remains at zero current. If there is no triggering signal at the base of the Darlington, T4 is at zero current and short-circuit transistor T3 is supplied with base current over the high-resistance protective resistor R3 and short circuits the base-emitter junction of the Darlington. With this circuit arrangement, the Zener diode connected upstream from the short-circuit transistor can be omitted. The base input resistor R4 allows transition from Darlington operation at zero current (short-circuit transistor T3 active) into triggered operation (short-circuit transistor T3 open). Voltage divider R5/R6 prevents the triggering current from being lost at transistor T4. At the same time this voltage divider ensures that, independently of the voltage of the base-emitter junction, the ON threshold of transistor T1 is reached. This circuit according to FIG. 3 has the advantage that in contrast to the exemplary embodiments in FIGS. 1 and 2, a successive spark ignition is also possible since short-circuit transistor T3 switches off again so that the Darlington can switch on again.

Figure 4:
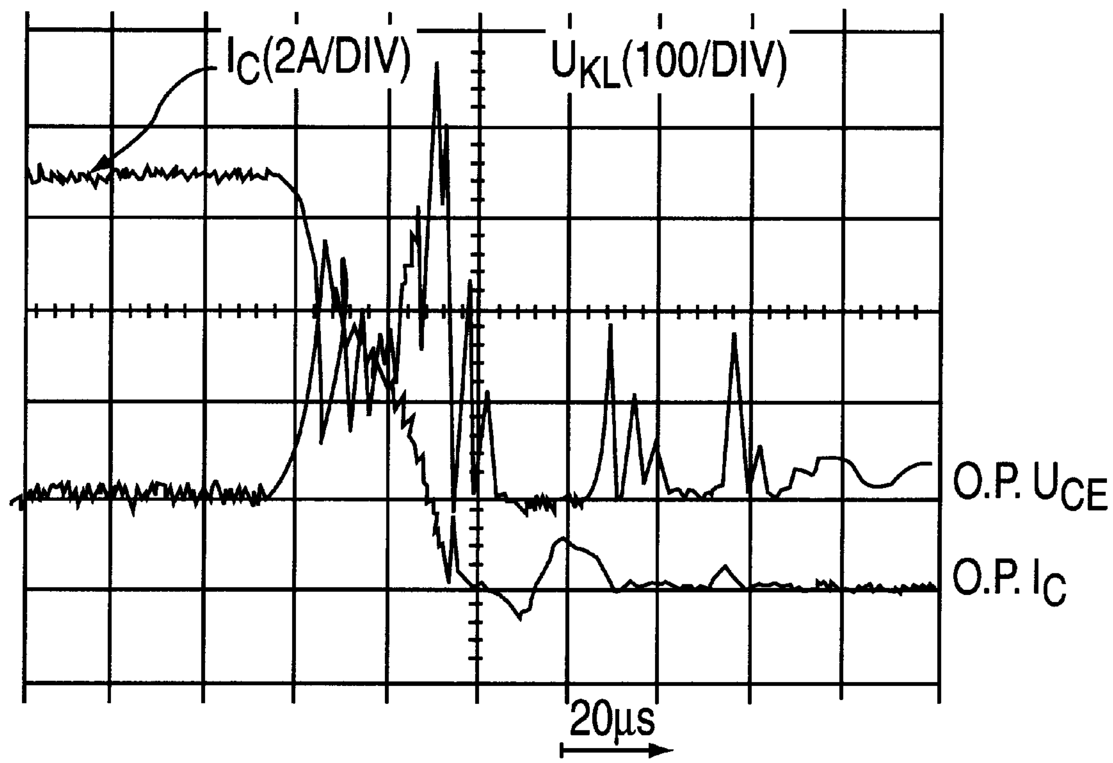
FIG. 4 shows a clamp voltage curve without short-circuit transistor.
Figure 5:
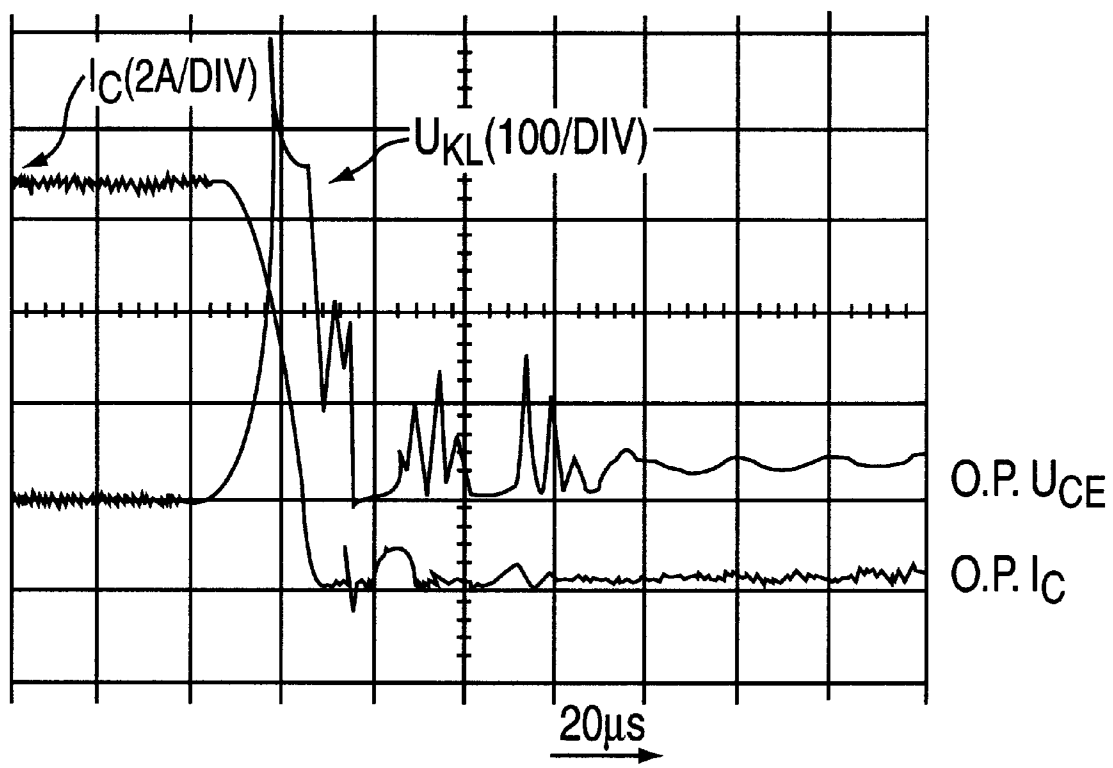
FIG. 5 shows another clamp voltage curve with short-circuit transistor.

The operating mode of the exemplary embodiments will be explained again using FIGS. 4 and 5. Here, the voltage curves are shown once without short-circuit transistor (FIG. 4) and once with short-circuit transistor (FIG. 5). The tested ignition circuit is a three-stage Darlington with internal clamping directly to the triggering transistor T1, while the short-circuit transistor T3 acts on the third base of the Darlington transistor. Without short-circuit transistor T3, the clamping reaches its full value only after approximately 30 $\mu$s, accompanied by several voltage dips; the collector current decays only slowly and never in a linear manner, according to the multiple on-off switching effects. The voltage in an ignition circuit with short-circuit transistor T3 is reached only after 20 $\mu$s. The overshoot is connected with the special clamping system, in which capacitive and resistive dividers are not precisely tuned. Such improvement of the switching process and the suppression of parasitic re-closing of clamps, allows the circuit to be used for all ignition applications.

Frequently there are also ignition systems in which the ignition Darlington is Zenered externally by the outer base terminal. Here, the short-circuit transistor must be wired as shown in FIG. 2.

From control modules, it is already known in the art that the ignition Darlington can be set up as an integrated circuit. But here as well, the short-circuit transistor can also be well integrated monolithically into this circuit.

Figure 6:
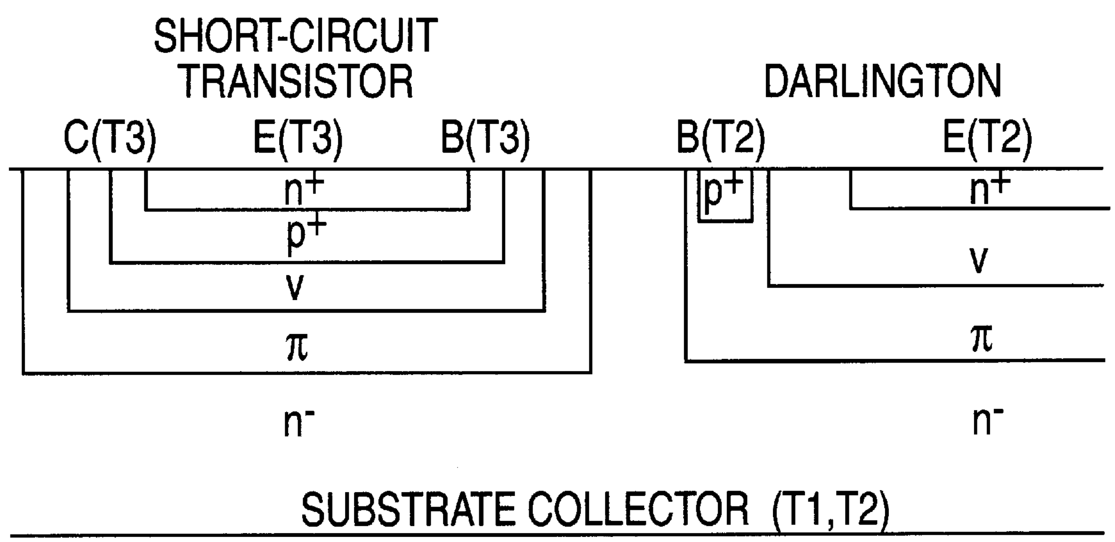
FIG. 6 shows a short-circuit transistor integrated monolithically in the ignition Darlington.

Short-circuit transistor T3 is integrated by means of isolation diffusion so that the collector of short-circuit transistor T3 is separate from the collector of the Darlington. In these isolation diffusions, the N+ and P+ troughs are embedded in further $\gamma$ and $\pi$ troughs as shown in FIG. 6. Because of the high-resistance $\gamma$ and $\pi$ diffusions, base and collector of the short circuit can be effectively isolated from the substrate collector. The locking capability of the T3 collector-base junction absolutely must correspond to the clamping voltage since most of the clamping voltage drops off in the resistor R3 connected upstream from it.

In the same manner, an integration of the Zener diode is implemented by a p zone embedded in 2 $\gamma/\pi$ troughs with reverse voltages of 20–50 V. The Zener diode is also isolated from the substrate collector again by $\pi$ diffusion.

Integration of protective resistor R3 requires a relatively large surface, so the cover electrode resistors already present can also be used as triggering resistor for short-circuit transistor T3. Thus there is no need for additional surface area for the triggering resistor in the cover electrode clamping.

What is claimed is:

1. An ignition output stage for an internal combustion engine, comprising:

a Darlington transistor including a driver transistor, a control transistor, a collector, a base-emitter junction, and an internal clamping, the driver transistor having a collector-emitter junction, the internal clamping using a first Zener diode coupled in parallel to the collector-emitter junction of the driver transistor;

a short-circuit transistor including a collector-emitter junction and a control terminal, the collector-emitter junction of the short-circuit transistor being coupled in parallel to the base-emitter junction of the Darlington transistor; and a high-resistance protective resistor dimensioned such that an adequate base current flows for the short-circuit transistor, wherein the control terminal of the short-circuit transistor is coupled to the collector of the Darlington transistor via a series connection of the high-resistance protective resistor and a second Zener diode, wherein the second Zener diode has a blocking voltage in a range from 20 to 50 volts.

2. The ignition output stage according to claim 1, further comprising:

a decoupling diode coupled between the collector-emitter junction of the short-circuit transistor and the control transistor of the Darlington transistor.

3. The ignition output stage according to claim 1, wherein the short-circuit transistor becomes active in a time period of approximately 20 microseconds after a clamping operation is made active.

4. An ignition output stare for an internal combustion engine, comprising:

a Darlington transistor including a driver transistor, a control transistor, a collector, a base-emitter junction, and an internal clamping, the driver transistor having a collector-emitter junction, the internal clamping using a first Zener diode coupled in parallel to the collector-emitter junction of the driver transistor;

a short-circuit transistor including a collector-emitter junction and a control terminal, the collector-emitter junction of the short-circuit transistor being coupled in parallel to the base-emitter junction of the Darling transistor;

a high-resistance protective resistor dimensioned such that an adequate base current flows for the short-circuit transistor, wherein the control terminal of the short-circuit transistor is coupled to the collector of the Darling transistor via a series connection of the high-resistance protective resistor and a second Zener diode, a fourth transistor including a collector, an emitter and a base, the collector of the fourth transistor being coupled between the high-resistance protective resistor and the control terminal of the short-circuit transistor, wherein the base of the fourth transistor is coupled to the control transistor of the Darlington transistor via a voltage divider; and wherein the emitter of the fourth transistor is coupled to a ground.

5. The ignition output stage according to claim 4, wherein the driver transistor, the control transistor, the first Zener diode, the second Zener diode, the short-circuit transistor, the high-resistance protective resistor and the fourth transistor are integrated monolithically.

* * * * *